(12) United States Patent
Yang (10) Patent No.: US 7,045,463 B2
(45) Date of Patent: May 16, 2006

(54) METHOD OF ETCHING CAVITIES HAVING DIFFERENT ASPECT RATIOS

(75) Inventor: Chen-Hsiung Yang, Taipei Hsien (TW)

(73) Assignee: Touch Micro-System Technology Inc., Taoyuan (TW)

( * ) Notice: Subject to any disclaimer, the term of this patent is extended or adjusted under 35 U.S.C. 154(b) by 0 days.

(21) Appl. No.: 10/904,188

(22) Filed: Oct. 28, 2004

(65) Prior Publication Data

US 2006/0024965 A1    Feb. 2, 2006

(30) Foreign Application Priority Data

Jul. 30, 2004    (TW)    ............... 93122943 A (51) Int. Cl.
*H01L 21/302*    (2006.01)
*H01L 21/461*    (2006.01)

(52) U.S. Cl. ............ 438/689; 438/424; 438/301; 438/53; 438/52; 438/202; 438/781; 438/671

(58) Field of Classification Search ............ 438/689, 438/52

See application file for complete search history.

(56) References Cited

U.S. PATENT DOCUMENTS

| 2002/0045136 A1* | 4/2002 | Fritze et al. ............ 430/322 |
| 2002/0127760 A1* | 9/2002 | Yeh et al. ............ 438/50 |
| 2003/0066816 A1* | 4/2003 | Schultz et al. ............ 216/41 |
| 2004/0087054 A1* | 5/2004 | Chinn et al. ............ 438/52 |
| 2005/0054153 A1* | 3/2005 | Asami et al. ............ 438/202 |

* cited by examiner

*Primary Examiner*—David Zarneke
*Assistant Examiner*—Igwe U. Anya
(74) *Attorney, Agent, or Firm*—Winston Hsu (57) ABSTRACT

A method of etching cavities having different aspect ratios. An etching stop layer is formed on the bottom surface of a substrate, and a mask pattern is formed on the top surface of the substrate. The mask pattern includes a plurality of sacrificial patterns positioned on both a first cavity predetermined region and a second cavity predetermined region. Then, an etching process is performed to remove the substrate not covered by the mask layer. Then, the etching stop layer is removed, as well as the sacrificial patterns and the substrate covered by the sacrificial patterns.

11 Claims, 10 Drawing Sheets

METHOD OF ETCHING CAVITIES HAVING DIFFERENT ASPECT RATIOS

BACKGROUND OF INVENTION

1. Field of the Invention

The present invention relates to a method of etching cavities having different aspect ratios, and more particularly, to a method of etching by means of sacrificial patterns.

2. Description of the Prior Art

Etching processes are the most common semiconductor technologies. The purpose of an etching process is to partially remove unnecessary thin film or substrate so as to define required structures or patterns. In the course of an etching process, the thin film not covered by a mask layer, such as a photo resist pattern, is removed chemically (i.e. by using an etching solution) or physically and chemically (i.e. by using plasma), thereby forming devices.

As MEMS (micro electromechanical system) devices, which have more complicated structures than semiconductor devices (for example, the wafer must be etched through), are developed, the yield of the etching process is more important than ever. Especially when cavities (or through cavities) having different aspect ratios need to be formed in a single etching process, the etching yield is frequently diminished due to different aspect ratios in different cavities. This is referred to as the Aspect-Ratio Dependent Etching (ARDE) effect.

Figure 1:
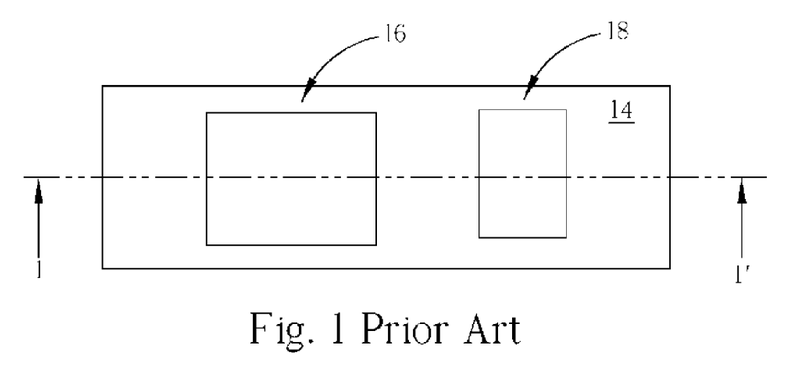
FIG. 1 to FIG. 4 are schematic diagrams illustrating a conventional method of forming cavities having different aspect ratios.
Figure 2:
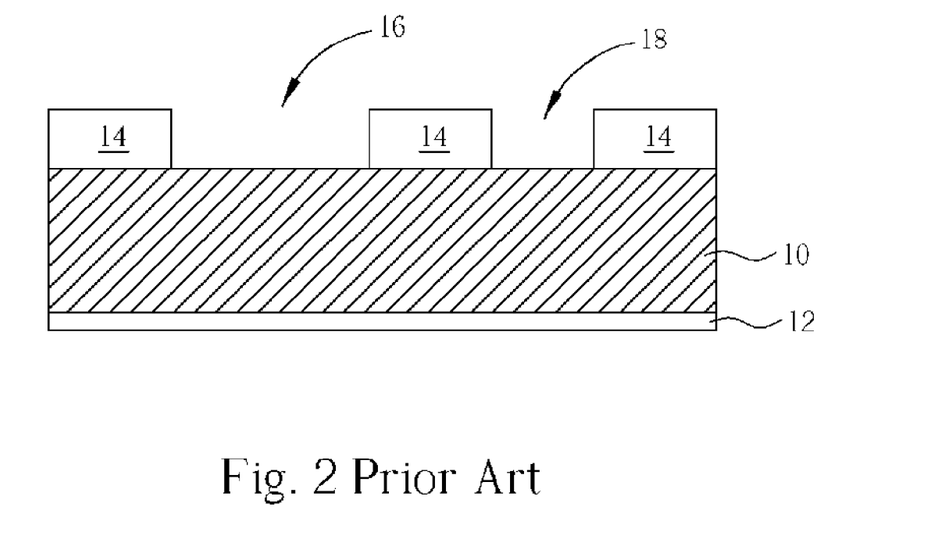
Figure 3:
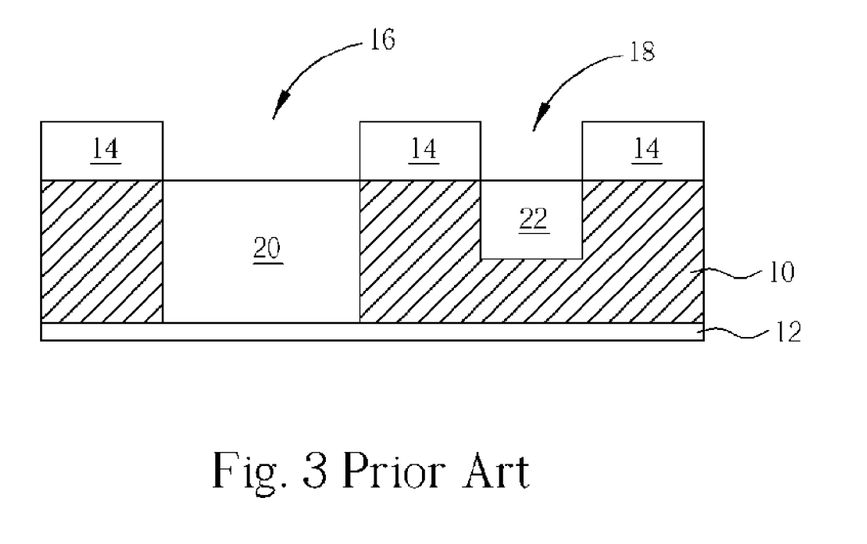
Figure 4:
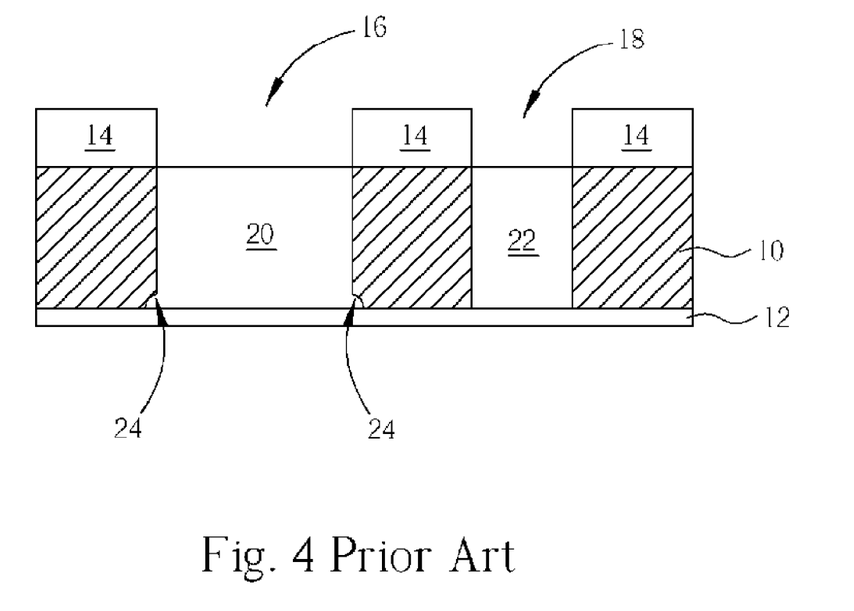

Please refer to FIG. 1 through FIG. 4. FIG. 1 through FIG. 4 are schematic diagrams illustrating a conventional method of forming cavities having different aspect ratios, where FIG. 1 is a top view of a substrate 10, and FIG. 2 through FIG. 4 are cross-sectional views of the substrate 10 along line 1–1'. As shown in FIG. 1 and FIG. 2, a substrate 10 is provided. Then an etching stop layer 12 is formed on the bottom surface of the substrate 10, and a photo resist pattern 14 is formed on the top surface of the substrate 10. The photo resist pattern 14 is used to define a first cavity predetermined region 16 and a second cavity predetermined region 18 in the substrate 10.

Next, as shown in FIG. 3, an etching process is performed to remove the substrate 10 not covered by the photo resist pattern 14 to form a first cavity 20 and a second cavity 22 in the first cavity predetermined region 16 and the second cavity predetermined region 18, respectively. The first cavity 20 and the second cavity 22 have different aspect ratios, and thus lead to etching rate divergences. As shown in FIG. 3, while the substrate 10 in the first cavity predetermined region 16 has been etched through and stopped in the etching stop layer 12, the substrate 10 in the second cavity predetermined region 18 is not completely etched due to a slower etching rate.

As shown in FIG. 4, due to the slower rate in the second cavity predetermined region 18, the etching process must be continued until the substrate 10 is etched through so as to form the second cavity 22. However, if the etching process continues, the substrate 10 in the first cavity predetermined region 16 will be over-etched. The over-etching will cause damage to the inner walls or generate an undercut 24, and thus will result in structural deviations in the MEMS device.

It can be seen that the conventional method of etching cavities having different aspect ratios suffers from over-etching problems due to unequal etching rates. In view of this disadvantage, a new method of etching cavities having different aspect ratios is demanded.

SUMMARY OF INVENTION

It is therefore a primary objective of the present invention to provide a method of etching cavities having different aspect ratios to overcome the aforementioned difficulty.

According to a preferred embodiment of the claimed invention, a method of etching cavities having different aspect ratios is disclosed. First, a substrate is provided, and an etching stop layer is formed on the bottom surface of the substrate. Then, a mask pattern is formed on the top surface of the substrate to define at least a first cavity predetermined region and at least a second cavity predetermined region. The mask pattern further includes a plurality of sacrificial patterns positioned over the first cavity predetermined region and the second cavity predetermined region. Afterward, an etching process is performed to etch the substrate not covered by the mask pattern down to the etching stop layer. Eventually, the etching stop layer and the substrate covered by the sacrificial patterns are all removed.

The method of the present invention makes use of a plurality of sacrificial patterns as a hard mask. The areas of the cavity predetermined regions not covered by the sacrificial patterns comprise a mathematical tiling of subregions with substantially equal aspect ratios. While the aspect ratios of the subregions are substantially equal, the subregions may vary in size. Thus the areas of the cavities of the substrate not covered by the sacrificial patterns can be considered to have substantially equal aspect ratios. The sacrificial patterns and the substrate covered by the sacrificial patterns are then removed along with the etching stop layer. In such a case, the over-etching problem due to the cavities being formed having different aspect ratios is avoided, and thus the etching yield is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
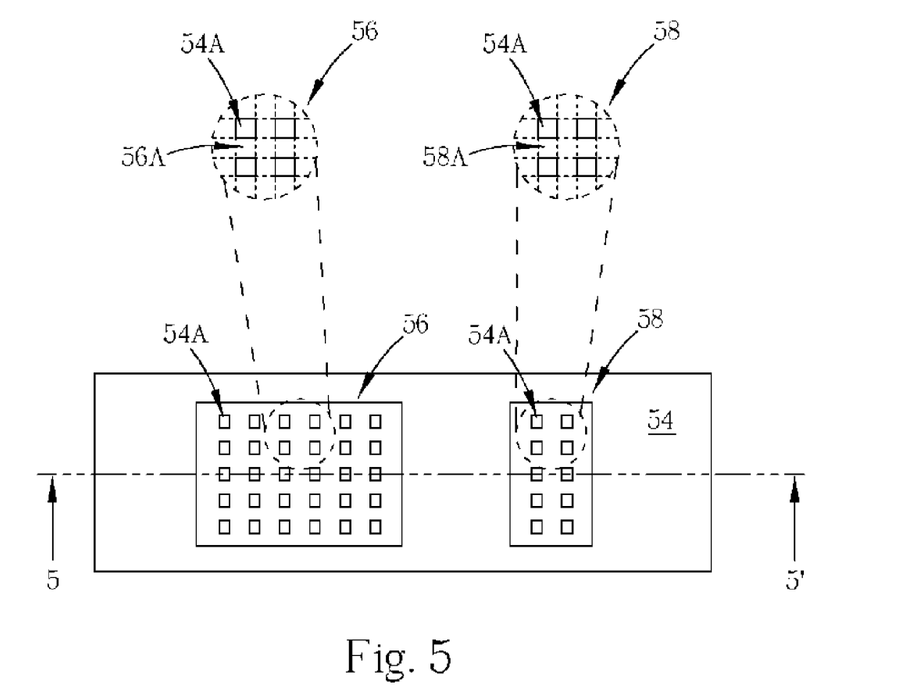
FIG. 5 to FIG. 8 are schematic diagrams illustrating a method of forming cavities having different aspect ratios according to a preferred embodiment of the present invention.
Figure 6:
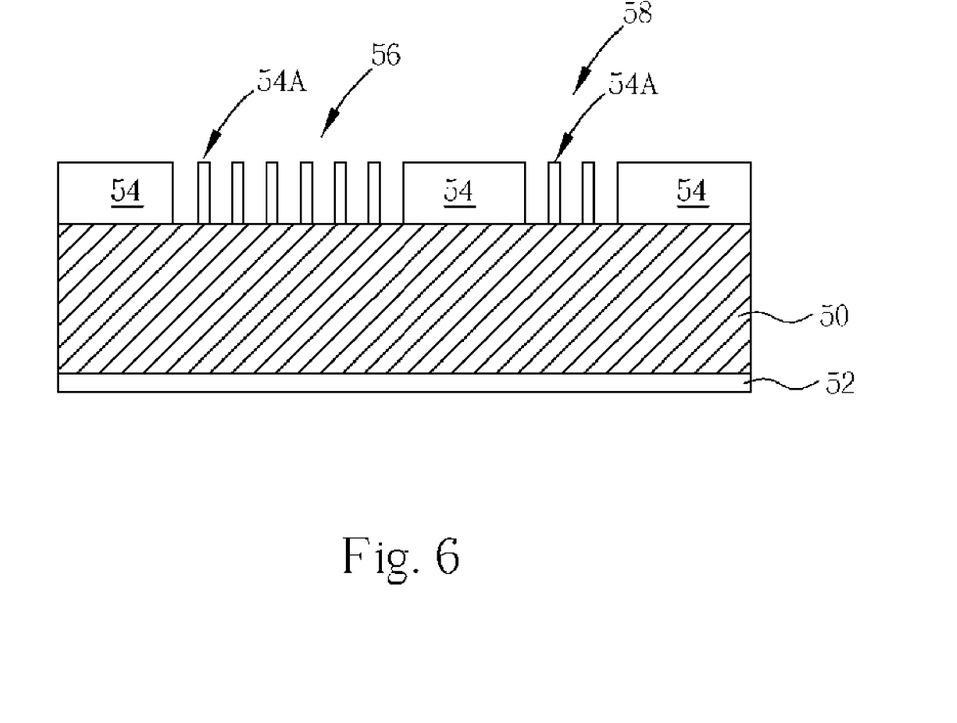
Figure 7:
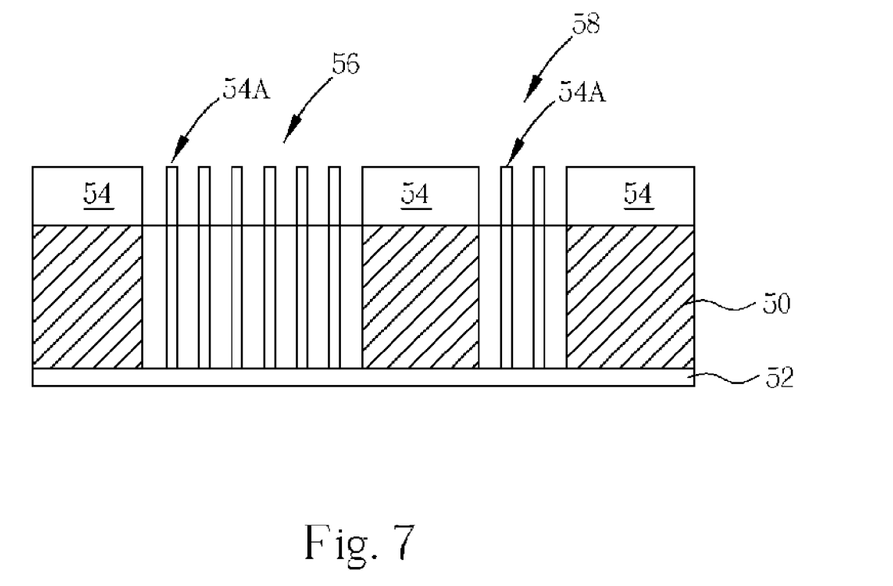
Figure 8:
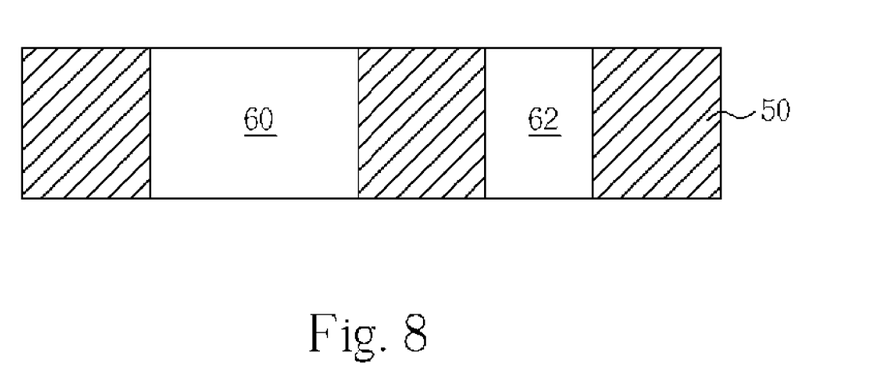

Please refer to FIG. 5 through FIG. 8. FIG. 5 through FIG. 8 are schematic diagrams illustrating a method of forming cavities having different aspect ratios according to a preferred embodiment of the present invention, where FIG. 5 is a top view of a substrate 50, and FIG. 6 through FIG. 8 are cross-sectional views of the substrate 50 along line 5–5'. As shown in FIG. 5 and FIG. 6, a substrate 50 is provided. Then an etching stop layer 52 and a mask pattern 54 are respectively formed on the bottom surface and the top surface of the substrate 50. The mask pattern 54 defines a first cavity predetermined region 56 and a second cavity predetermined region 58. The mask pattern 54 further includes a plurality of sacrificial patterns 54A positioned on both the first cavity predetermined region 56 and the second cavity predetermined region 58. In this embodiment, the mask pattern 54 is particularly, but not limited to, a photoresist material, and formed by a photolithography process. The material of the photo pattern 54 can also be a non-photoresist material, such as silicon oxide or silicon nitride, for enhancing masking ability. In addition, the sacrificial patterns 54A in effect create a plurality of subregions 56A and 58A (shown in the enlarged views in FIG. 5) having substantially equal critical dimensions during the etching process to be performed.

As shown in FIG. 7 and FIG. 8, an etching process (e.g. a reactive ion etching process) is performed to etch the substrate 50 not covered by the mask pattern 54 and the sacrificial patterns 54A down to the etching stop layer 52. Since the subregions 56A and 58A defined by the sacrificial patterns 54A make the first cavity predetermined region 56 and the second cavity predetermined region 58 have substantially equal critical dimensions, a plurality of cavities having similar aspect ratios are formed in the first cavity predetermined region 56 and the second cavity predetermined region 58. Accordingly, the etching rate divergences due to different aspect ratios are avoided.

Because the substrate 50 covered by the sacrificial patterns 54A is adhered to the etching stop layer 52, the sacrificial patterns 54A and the substrate 50 covered by the sacrificial patterns 54A can be removed together with the etching stop layer 52. Accordingly, a first cavity 60 and a second cavity 62 are formed. Finally, the mask pattern 54 positioned on the top surface of the substrate 50 is removed to finish fabrication of the first cavity 60 and the second cavity 62. In this embodiment, the etching stop layer 52 is selected from materials which can be removed by wet etching, heating, or irradiating, for example, photo resist, benzocyclobutene (BCB), polyimide, silicon oxide, metal, tape, UV tape, wax, and so on.

It can be seen that the present invention makes use of a plurality of sacrificial patterns as a hard mask when performing the etching process, so that the subregions effectively created by the sacrificial patterns substantially form cavities having equal aspect ratios. The sacrificial patterns and the substrate covered by the sacrificial patterns are then removed with the etching stop layer. Consequently, the problems in the etching process due to the different aspect ratios of the cavities being formed are prevented. It is to be appreciated that the sizes, distributions, and arrangement densities of the sacrificial patterns may be adjusted according to pattern densities of the mask pattern and parameters of the etching process. Specifically, when the mask pattern has uneven pattern densities, the sizes, distributions, and arrangement densities of the sacrificial patterns can be finely adjusted to avoid a micro loading effect. For example, if the density of the first cavities to be formed in a certain region is higher than the density of the second cavities to be formed in another region, the arrangement densities of sacrificial patterns in each first cavity predetermined region should be lower than the arrangement densities of sacrificial patterns in each second cavity predetermined region to provide substantially equal etching conditions and prevent a micro loading effect.

Figure 9:
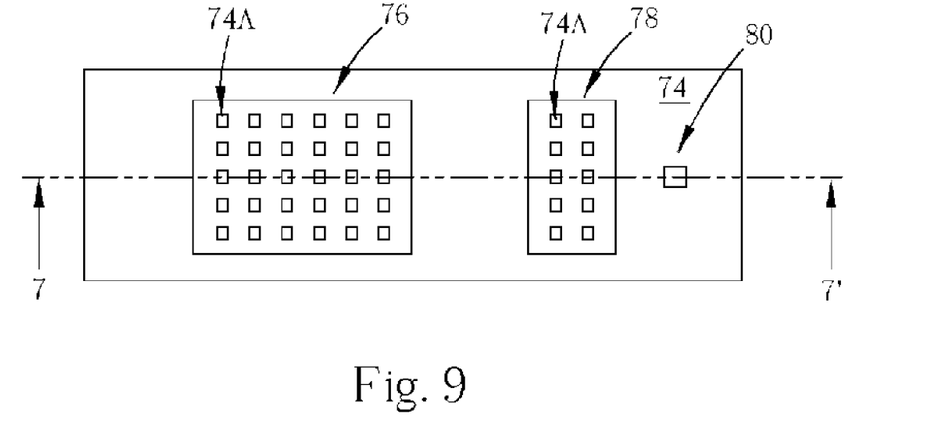
FIG. 9 and FIG. 10 are schematic diagrams illustrating a method of etching cavities having different aspect ratios according to another embodiment of the present invention.
Figure 10:
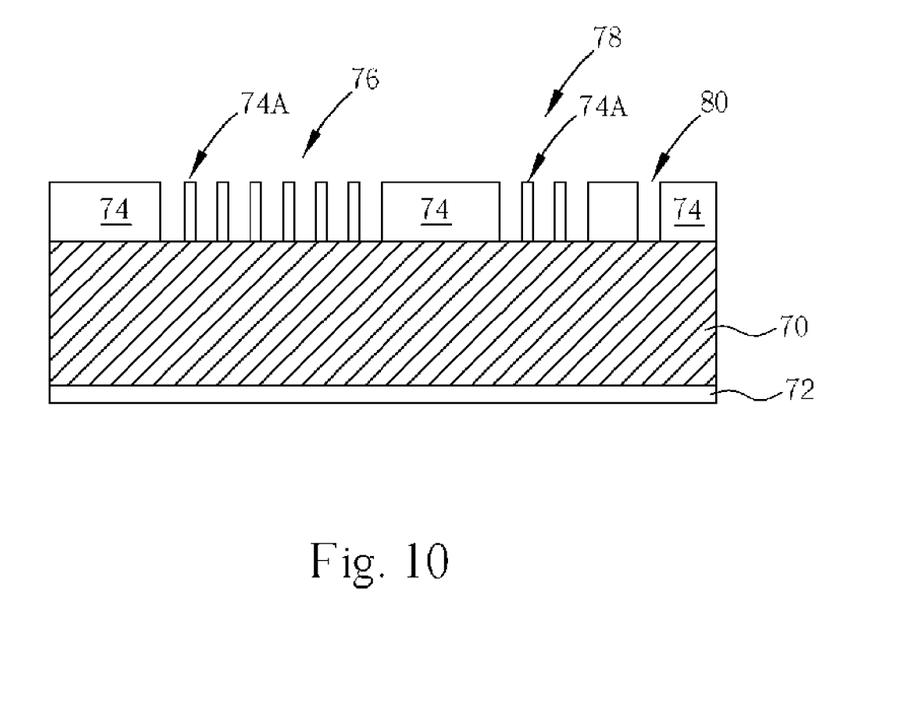

Furthermore, if some cavities to be formed have an aspect ratio far more than that of other cavities (referred to as the third cavity hereinafter), the dimensions of each third cavity can be a basis for creating the masks for other cavities. Specifically, the sacrificial patterns are designed to allow the subregions of other cavities, such as the first cavity and second cavity, to have aspect ratios substantially equal to the third cavity. Please refer to FIG. 9 and FIG. 10. FIG. 9 and FIG. 10 are schematic diagrams illustrating a method of etching cavities having different aspect ratios according to another embodiment of the present invention, where FIG. 9 is a top view of a substrate 70 and FIG. 10 is a cross-sectional view of the substrate 70 along line 7–7'. As shown in FIG. 9 and FIG. 10, a substrate 70 is provided. Then an etching stop layer 72 and a mask pattern 74 are respectively formed on the bottom surface and the top surface of the substrate 70. The mask pattern 74 defines a first cavity predetermined region 76, a second cavity predetermined region 78, and a third cavity predetermined region 80. The mask pattern 74 further includes a plurality of sacrificial patterns 74A positioned on both the first cavity predetermined region 76 and the second cavity predetermined region 78. Since the aspect ratio of the third cavity predetermined region 80 is far more than the aspect ratios of the first cavity predetermined region 76 and the second cavity predetermined region 78, the method according to this embodiment adjusts the sacrificial patterns 74A such that the subregions of the first predetermined region 76 and the second cavity predetermined region 78 have substantially the same aspect ratios as the third cavity predetermined region 80. Descriptions of the etching process to be performed are disclosed earlier, and thus are not recited here for simplicity.

The above embodiments are normally, but not limited to, applied to cases in which the substrate is etched through. The method according to the claimed invention can also be applied to cases in which the substrate is not etched through. In such cases, the etching stop layer is no longer required, and an isotropic etching process is performed to remove the substrate covered by the sacrificial patterns as well as the sacrificial patterns, after the substrate not covered by the sacrificial patterns are etched to a predetermined depth.

In contrast with the prior art, the method according to the present invention makes use of a plurality of sacrificial patterns as a hard mask, and thus the positions in the substrate not covered by the sacrificial patterns have equal aspect ratios. The sacrificial patterns and the substrate covered by the sacrificial patterns are then removed along with the etching stop layer. In such a case, the over-etching problem due to the different aspect ratios of the cavities being formed is avoided, and thus the etching yield is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of etching through cavities having different aspect ratios, comprising:

providing a substrate;

forming an etching stop layer on a bottom surface of the substrate;

forming a mask pattern on a top surface of the substrate so as to define at least a first cavity predetermined region and at least a second cavity predetermined region, the mask pattern further comprising a plurality of sacrificial patterns on the first cavity predetermined region and the second cavity predetermined region, wherein the first cavity predetermined region has a dimension different from that of the second cavity predetermined region, and the sacrificial patterns make the first cavity predetermined region and the second cavity predetermined region have same critical dimensions;

performing an etching process to etch through the substrate not covered by the mask pattern until reaching the etching stop layer; and removing the etching stop layer, the sacrificial patterns and the substrate covered by the sacrificial patterns.

2. The method of claim 1, wherein sizes, distributions, and arrangement densities of the sacrificial patterns are adjusted according to pattern densities of the mask pattern and parameters of the etching process.

3. The method of claim 1 further comprising the step of removing the mask pattern.

4. The method of claim 1, wherein the mask pattern further defines a third cavity predetermined region without any sacrificial patterns on the top surface of the substrate.

5. A method of etching cavities having different aspect ratios, comprising:

providing a substrate having at least a first cavity predetermined region and at least a second cavity predetermined region on a top surface;

forming a mask pattern on the top surface of the substrate, the mask pattern exposing the first cavity predetermined region and the second cavity predetermined region, and the mask pattern further comprising a plurality of sacrificial patterns on the first cavity predetermined region and the second cavity predetermined region, wherein the first cavity predetermined region has a dimension different from that of the second cavity predetermined region, and the sacrificial patterns make the first cavity predetermined region and the second cavity predetermined region have same critical dimensions;

performing an etching process to etch the substrate not covered by the mask pattern; and removing the sacrificial patterns and the substrate covered by the sacrificial patterns.

6. The method of claim 5 wherein sizes, distributions, arrangement densities of the sacrificial patterns are adjusted according to pattern densities of the mask pattern and parameters of the etching process.

7. The method of claim 5 further comprising forming an etching stop layer on a bottom surface of the substrate before performing the etching process.

8. The method of claim 7, wherein the substrate is etched through until reaching the etching stop layer during the etching process.

9. The method of claim 8, wherein the sacrificial patterns and the substrate covered by the sacrificial patterns are removed along with the etching stop layer.

10. The method of claim 5 further comprising the step of removing the mask pattern.

11. The method of claim 5 wherein the top surface of the substrate further comprises at least a third cavity predetermined region without any sacrificial patterns thereon.

* * * * *